(12) United States Patent
Huang et al.

(10) Patent No.: US 10,700,126 B2
(45) Date of Patent: Jun. 30, 2020

(54) MAGNETORESISTIVE RANDOM ACCESS MEMORY WHEREIN NUMBER OF MEMORY CELLS IN EACH STRING IS EQUAL TO NUMBER OF STRINGS CONNECTED IN PARALLEL

(71) Applicant: UNITED MICROELECTRONICS CORP., Hsin-Chu (TW)

(72) Inventors: Ting-Hsiang Huang, Tainan (TW); Yi-Chung Sheng, Tainan (TW); Sheng-Yuan Hsueh, Tainan (TW); Kuo-Hsing Lee, Hsinchu County (TW); Chih-Kai Kang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/167,485

(22) Filed: Oct. 22, 2018

(65) Prior Publication Data
US 2020/0091229 A1   Mar. 19, 2020

(30) Foreign Application Priority Data

Sep. 18, 2018   (CN) .......................... 2018 1 1086211

(51) Int. Cl.
*H01L 27/22* (2006.01)
*G11C 11/16* (2006.01)
*H01L 43/08* (2006.01)

(52) U.S. Cl.
CPC .......... *H01L 27/226* (2013.01); *G11C 11/161* (2013.01); *G11C 11/1655* (2013.01); *G11C 11/1673* (2013.01); *H01L 43/08* (2013.01)

(58) Field of Classification Search
CPC ... H01L 27/226; H01L 43/08; G11C 11/1655; G11C 11/1673; G11C 11/161
See application file for complete search history.

(56) References Cited

U.S. PATENT DOCUMENTS

| | | | |
|---|---|---|---|
| 6,809,976 B2 | 10/2004 | Ooishi | |
| 9,734,883 B1 | 8/2017 | Yu et al. | |
| 9,786,363 B1* | 10/2017 | Hong | .................... G11C 11/418 |
| 2003/0086314 A1 | 5/2003 | Okazawa et al. | |
| 2003/0103377 A1* | 6/2003 | Kajiyama | ............... G11C 11/15 365/157 |
| 2011/0122674 A1 | 5/2011 | Lin et al. | |
| 2012/0212857 A1* | 8/2012 | Fuji | ........................ B82Y 10/00 360/244 |
| 2013/0201755 A1* | 8/2013 | Ezaki | .................... G11C 11/161 365/158 |
| 2013/0293286 A1* | 11/2013 | Li | .......................... G11C 7/062 327/538 |
| 2019/0258482 A1* | 8/2019 | Jaiswal | ............... G06F 9/30036 |

* cited by examiner

*Primary Examiner* — Harry W Byrne
*Assistant Examiner* — Sultana Begum
(74) *Attorney, Agent, or Firm* — Winston Hsu

(57) ABSTRACT

A magnetic random access memory (MRAM) includes device strings coupled in parallel, each comprising magnetic tunnel junctions (MTJs) coupled in serial, wherein a quantity of the MTJs of each of the device strings is equal to a quantity of the device strings, and an equivalent resistance ($R_{eq}$) of the MTJs is equal to an average of the sum of a high resistance of one of the MTJs and a low resistance of another MTJ.

19 Claims, 4 Drawing Sheets

MAGNETORESISTIVE RANDOM ACCESS MEMORY WHEREIN NUMBER OF MEMORY CELLS IN EACH STRING IS EQUAL TO NUMBER OF STRINGS CONNECTED IN PARALLEL

BACKGROUND OF THE INVENTION

1. Field of the Invention

The invention relates to a magnetoresistive random access memory (MRAM), and more particularly to a reference circuit of a MRAM.

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

According to an embodiment of the present invention, a magnetic random access memory (MRAM) includes device strings coupled in parallel, each comprising magnetic tunnel junctions (MTJs) coupled in serial, wherein a quantity of the MTJs of each of the device strings is equal to a quantity of the device strings, and an equivalent resistance ($R_{eq}$) of the MTJs is equal to an average of the sum of a high resistance of one of the MTJs and a low resistance of another MTJ.

According to an embodiment of the present invention, each of the device strings comprises a first device string and a second device string coupled in parallel, wherein the first device string comprises a first reference cell and a second reference cell, the first reference cell and the second reference cell are coupled in serial, and the first reference cell comprises a first MTJ and the second reference cell comprises a second MTJ. Preferably, each of the first MTJ and the second MTJ comprises a free layer and a pinned layer, in which the pinned layer of the first MTJ is coupled to the pinned layer of the second MTJ or the free layer of the first MTJ is coupled to the free layer of the second MTJ.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
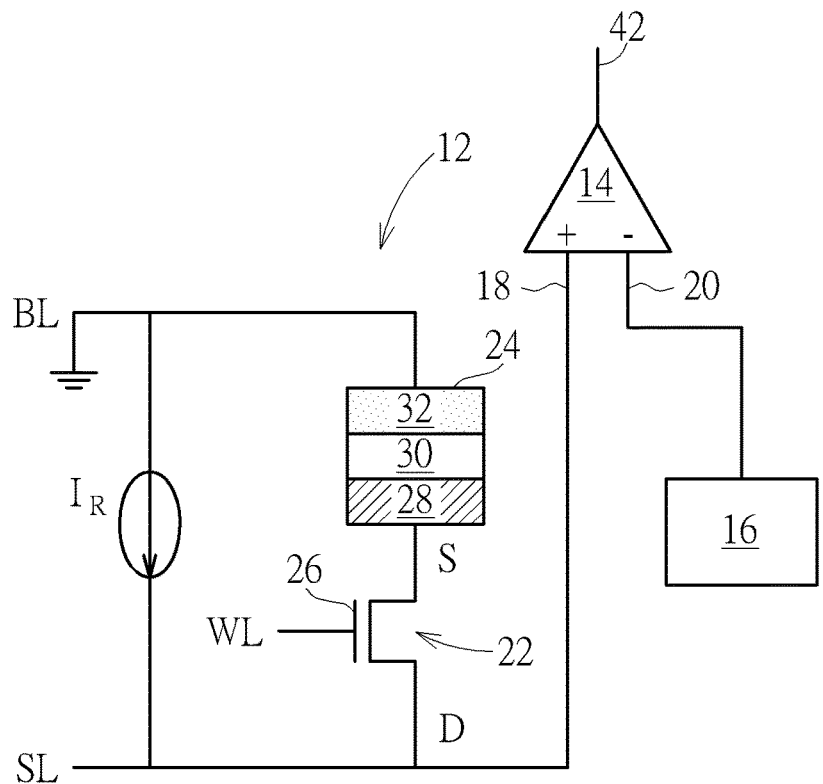
FIG. 1 illustrates a circuit diagram of a MRAM according to an embodiment of the present invention.

Referring to FIG. 1, FIG. 1 illustrates a circuit diagram of a MRAM according to an embodiment of the present invention. As shown in FIG. 1, the MRAM preferably includes a memory cell 12, a sense amplifier 14, and a reference array 16, in which the sense amplifier 14 includes a first input terminal 18 coupled to the memory cell 12, a second input terminal 20 coupled to the reference array 16, and an output 42.

Specifically, the memory cell 12 further includes a transistor 22 such as MOS transistor, a MTJ 24, a bit line BL, a word line WL, and a scan line SL, in which the transistor 22 includes a source S coupled to one end of the MTJ 24, a gate 26 coupled to the word line WL, and a drain D coupled to the scan line SL and the sense amplifier 14. The bit line BL is coupled to another of the MTJ 24.

In this embodiment, the MTJ 24 could include a bottom electrode (not shown), a pinned layer 28, a barrier layer 30, a free layer 32, a capping layer (not shown), and a top electrode (not shown). Preferably, the top electrode layer and the bottom electrode are preferably made of conductive material including but not limited to for example Ta, Pt, Cu, Au, Al, or combination thereof. The pinned layer 28 could be made of antiferromagnetic (AFM) material including but not limited to for example ferromanganese (FeMn), platinum manganese (PtMn), iridium manganese (IrMn), nickel oxide (NiO), or combination thereof, in which the pinned layer 28 is formed to fix or limit the direction of magnetic moment of adjacent layers. The barrier layer 30 could include material such as MgO, AlN, AlON, other non-magnetic material, or even dielectric material. The free layer 32 could be made of ferromagnetic material including but not limited to for example iron, cobalt, nickel, or alloys thereof such as cobalt-iron-boron (CoFeB), in which the magnetized direction of the free layer 32 could be altered freely depending on the influence of outside magnetic field. The capping layer could be made of insulating material including but not limited to for example oxides such as aluminum oxide ($AlO_x$) or magnesium oxide (MgO).

It should be noted that the source S of the transistor 22 is preferably directly connected or coupled to the pinned layer 28 or pinned layer end of the MTJ 24 while the bit line BL is coupled to the free layer 32 or free layer end of the MTJ 24, or if viewed from the MTJ 24 perspective the free layer 32 or free layer end is coupled to ground while the pinned layer 28 or pinned layer end is coupled to the source S. Moreover the circuit of this embodiment also includes a reverse read current $I_R$ flowing from the bit line BL toward the drain D of the transistor 22 and the sense amplifier 14. By inputting the reverse read current $I_R$ from the scan line SL to the sense amplifier 14, the present embodiment could create a source degeneration phenomenon to increase or boost up the read margin.

Figure 2:
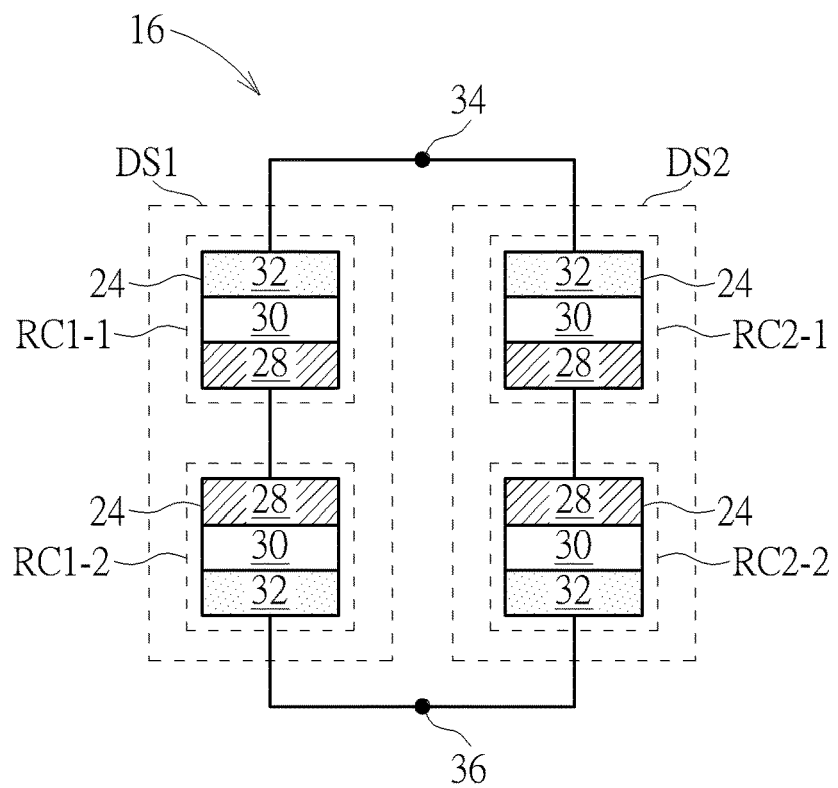
FIG. 2 illustrates a perspective diagram of a reference array according to an embodiment of the present invention.
Figure 3:
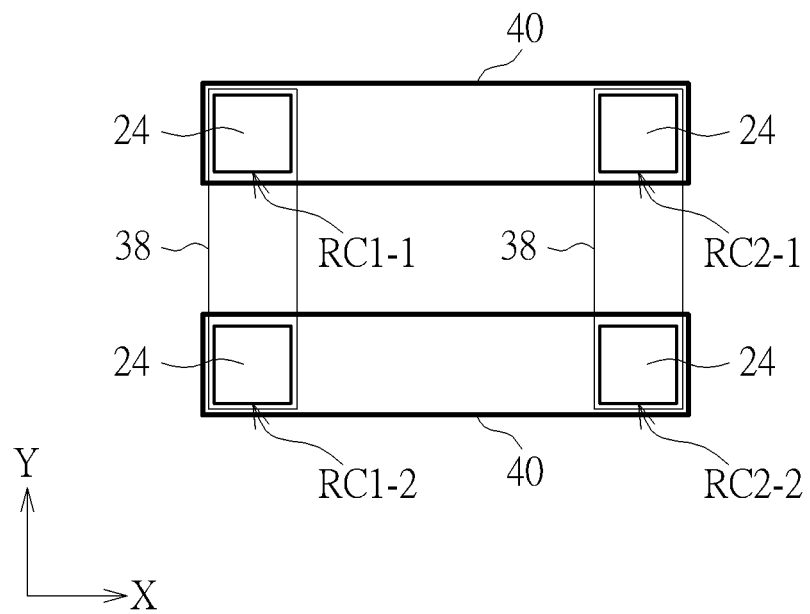
FIG. 3 illustrates a top view of connecting pinned layers of MTJs to pinned layers of adjacent MTJs in the reference array as shown in FIG. 2.
Figure 4:
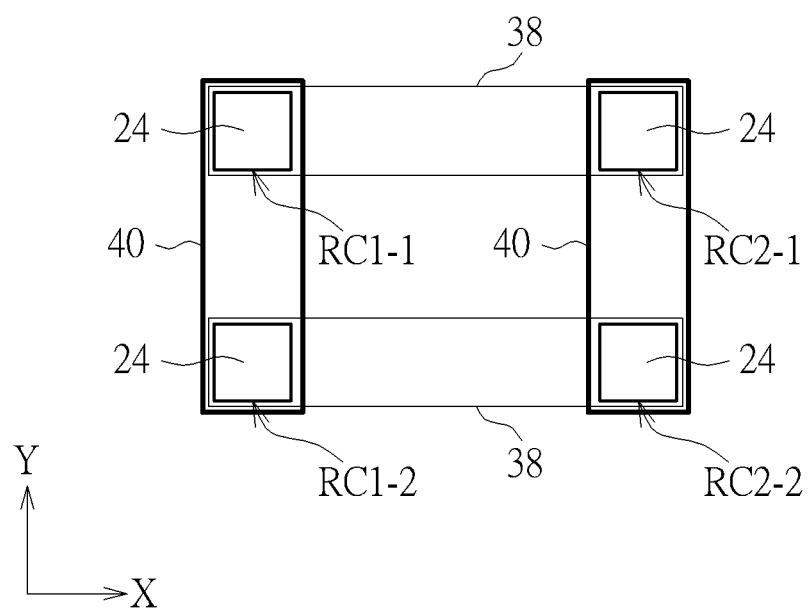
FIG. 4 illustrates a top view of connecting free layers of MTJs with free layers of adjacent MTJs in the reference array as shown in FIG. 2.

Referring to FIGS. 2-4, FIG. 2 illustrates a perspective diagram of a reference array according to an embodiment of the present invention, FIG. 3 illustrates a top view of connecting pinned layers of MTJs to pinned layers of adjacent MTJs in the reference array as shown in FIG. 2, and FIG. 4 illustrates a top view of connecting free layers of MTJs with free layers of adjacent MTJs in the reference array as shown in FIG. 2. As shown in FIG. 2, the reference array preferably includes a plurality of device strings coupled in parallel at nodes 34, 36, the sense amplifier 14 is coupled to each of the device strings through the node 34, each of the device strings includes a plurality of MTJs coupled in serial, and the number or quantity of the MTJs of each of the device strings is equal to a quantity of the device strings. Specifically, the present embodiment includes a first device string DS1 and a second device string DS2 coupled in parallel, in which each of the first device string DS1 and the second device string DS2 also includes two sets of reference cells. For instance the first device string DS1 includes a first reference cell RC1-1 and a second reference cell RC1-2 coupled in serial and the second device string DS2 includes a first reference cell RC2-1 and a second reference cell RC2-2 also coupled in serial, in which each of the first reference cell and the second reference cells from the device strings DS1 and DS2 further includes a MTJ 24.

In this embodiment, the MTJ 24 in each of the reference cells includes at least the aforementioned pinned layer 28, barrier layer 30, and free layer 32, and the pinned layer 28 or free layer 32 of the MTJs 24 in the first reference cell of each device string is preferably coupled to the same pinned layer 28 or free layer 32 of the MTJs in the second reference cell. For instance the connections in the first device string DS1 could include either connecting the pinned layer 28 of the MTJ 24 in first reference cell RC1-1 with the pinned layer 28 of the MTJ 24 in the second reference cell RC1-2 or connecting the free layer 32 of the MTJ 24 in the first reference cell RC1-1 with the free layer 32 of the MTJ 24 in the second reference cell RC1-2. Similarly, the connections in the second device string DS2 could include either connecting the pinned layer 28 of the MTJ 24 in first reference cell RC2-1 with the pinned layer 28 of the MTJ 24 in the second reference cell RC2-2 or connecting the free layer 32 of the MTJ 24 in the first reference cell RC2-1 with the free layer 32 of the MTJ 24 in the second reference cell RC2-2, which are all within the scope of the present invention.

In other words, the reference array of this embodiment preferably includes four MTJs 24 and the two MTJs 24 in the first device string DS1 and the two MTJs 24 in the second device strings DS2 are preferably arranged in the same manner. That is if the first reference cell RC1-1 in the first device string DS1 is connected to the second reference cell RC1-2 by connecting the pinned layer 28 in the MTJ 24 of the first reference cell RC1-1 to the pinned layer 28 in the MTJ 24 of the second reference cell RC1-2, then the first reference cell RC2-1 in the second device string DS2 would also be connecting the second reference cell RC2-2 by connecting the pinned layer 28 in the MTJ 24 of the first reference cell RC2-1 to the pinned layer 28 in the MTJ 24 of the second reference cell RC2-2. Conversely, if the first reference cell RC1-1 in the first device string DS1 is connected to the second reference cell RC1-2 by connecting the free layer 32 in the MTJ 24 of the first reference cell RC1-1 to the free layer 32 in the MTJ 24 of the second reference cell RC1-2, then the first reference cell RC2-1 in the second device string DS2 would also be connecting the second reference cell RC2-2 by connecting the free layer 32 in the MTJ 24 of the first reference cell RC2-1 to the free layer 32 in the MTJ 24 of the second reference cell RC2-2.

As shown in FIG. 3, if the first reference cell RC1-1 in the first device string DS1 is connected to the second reference cell RC1-2 by connecting the pinned layer 28 in the MTJ 24 of the first reference cell RC1-1 to the pinned layer 28 in the MTJ 24 of the second reference cell RC1-2, the metal interconnection 38 connecting the MTJ 24 of first reference cell RC1-1 and the MTJ 24 of second reference cell RC1-2 in the first device string DS1 is preferably a lower level metal interconnection and the metal connection 38 connecting the MTJ 24 of first reference cell RC2-1 and the MTJ 24 of second reference cell RC2-2 in the second device string DS2 is also a lower level metal interconnection while the metal interconnection 40 connecting the MTJ 24 of first reference cell RC1-1 in the first device string DS1 and the MTJ 24 of adjacent first reference cell RC2-1 is a different level or more specifically upper level metal interconnection and the metal interconnection 40 connecting the MTJ 24 of second reference cell RC1-2 and the MTJ 24 of adjacent first reference cell RC2-2 is also an upper level metal interconnection. In other words, the metal interconnection 38 connecting the first reference cell RC1-1 and second reference cell RC1-2 in the first device string DS1 and the metal interconnection 38 connecting the first reference cell RC2-1 and the second reference cell RC2-2 in the second device string DS2 are both lower level metal interconnections while the metal interconnection 40 connecting the first reference cell RC1-1 in the first device string DS1 and first reference cell RC2-1 in the second device string DS2 and the metal interconnection 40 connecting the second reference cell RC1-2 in the first device string DS1 and the second reference cell RC2-2 in the second device string DS2 are both upper level metal interconnections.

According to an embodiment of the present invention, as shown in FIG. 4, if the first reference cell RC1-1 in the first device string DS1 is connected to the second reference cell RC1-2 by connecting the free layer 32 in the MTJ 24 of the first reference cell RC1-1 to the free layer 32 in the MTJ 24 of the second reference cell RC1-2, the metal interconnection 40 connecting the MTJ 24 of first reference cell RC1-1 and the MTJ 24 of second reference cell RC1-2 in the first device string DS1 is preferably an upper level metal interconnection and the metal connection 40 connecting the MTJ 24 of first reference cell RC2-1 and the MTJ 24 of second reference cell RC2-2 in the second device string DS2 is also an upper level metal interconnection while the metal interconnection 38 connecting the MTJ 24 of first reference cell RC1-1 in the first device string DS1 and the MTJ 24 of adjacent first reference cell RC2-1 in the second device string DS2 is a different level or more specifically lower level metal interconnection and the metal interconnection 38 connecting the MTJ 24 of second reference cell RC1-2 and the MTJ 24 of adjacent first reference cell RC2-2 is also a lower level metal interconnection.

It should be noted that each of the MTJs 24 in the device strings could include a low resistance state (R0 or also referred to as P state) MTJ or a high resistance state (R1 or also referred to as AP state) MTJ. For instance in the device string DS1, the MTJ 24 of the first reference cell RC1-1 is preferably a low resistance MTJ 24 while the MTJ 24 of the second reference cell RC1-2 is a high resistance MTJ 24. In contrast to equivalence resistance ($R_{eq}$) of the MTJs being equal to either high resistance or low resistance of one of the MTJs in a reference array as in conventional art, the equivalence resistance ($R_{eq}$) of the MTJs 24 of the entire reference array is equal to an average of the sum of a high resistance of one of the MTJs 24 and a low resistance of another MTJs 24 according to an initial condition of the MTJs. In other words, the equivalence resistance ($R_{eq}$) of the MTJs 24 in the reference array 16 is not limited to any arrangement of the MTJs 24 and the equivalence resistance ($R_{eq}$) of the MTJs 24 could be obtained by adding the resistance of a low resistance MTJ from any MTJ in the reference array with the resistance of a high resistance MTJ from another MTJ in the reference array an then divide the sum by half. By using this approach to calculate the equivalence resistance ($R_{eq}$) of the MTJs it would be desirable to reduce of influence of outliers thereby achieving a much more stable reference voltage output.

Figure 5:
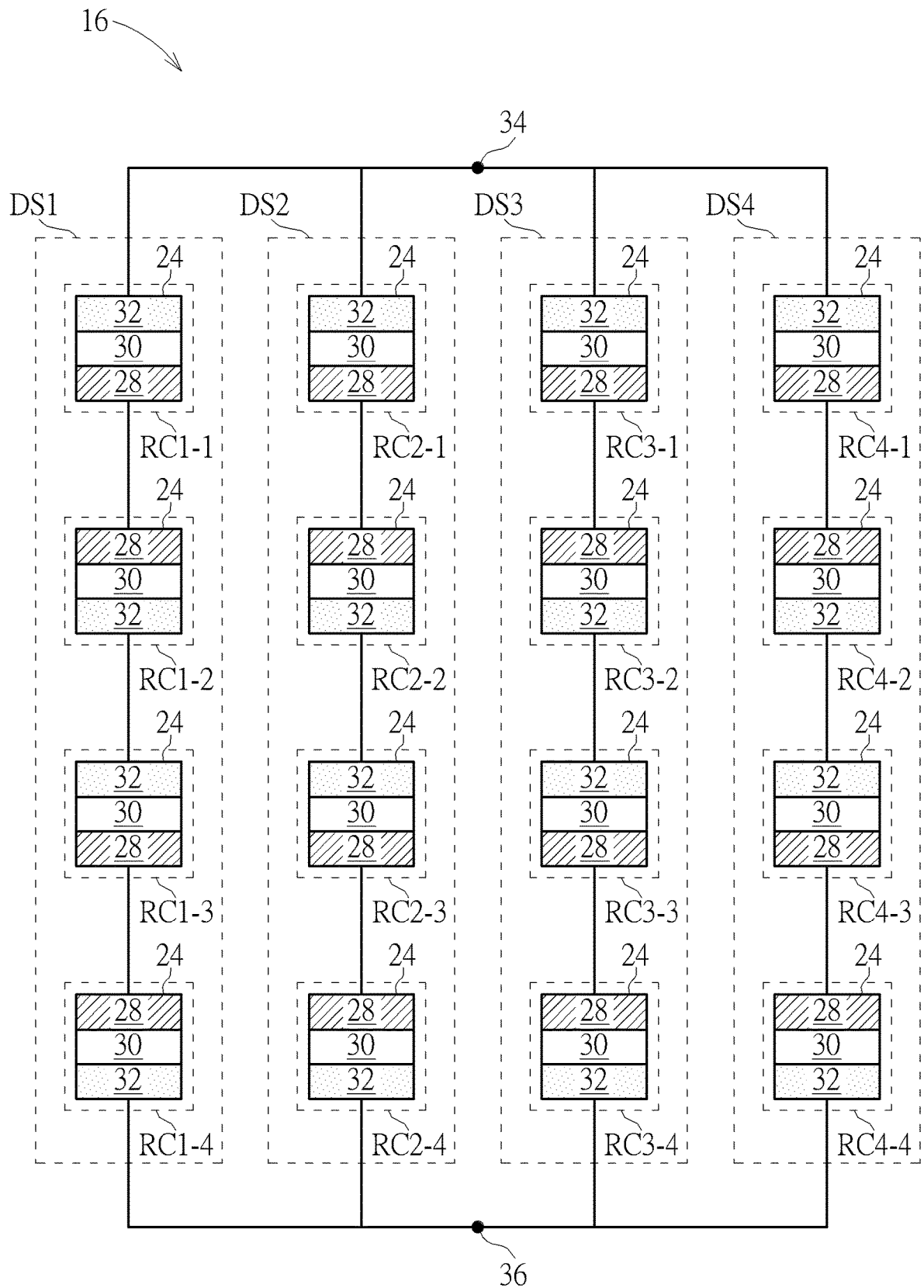
FIG. 5 illustrates a perspective diagram of a reference array according to an embodiment of the present invention.
Figure 6:
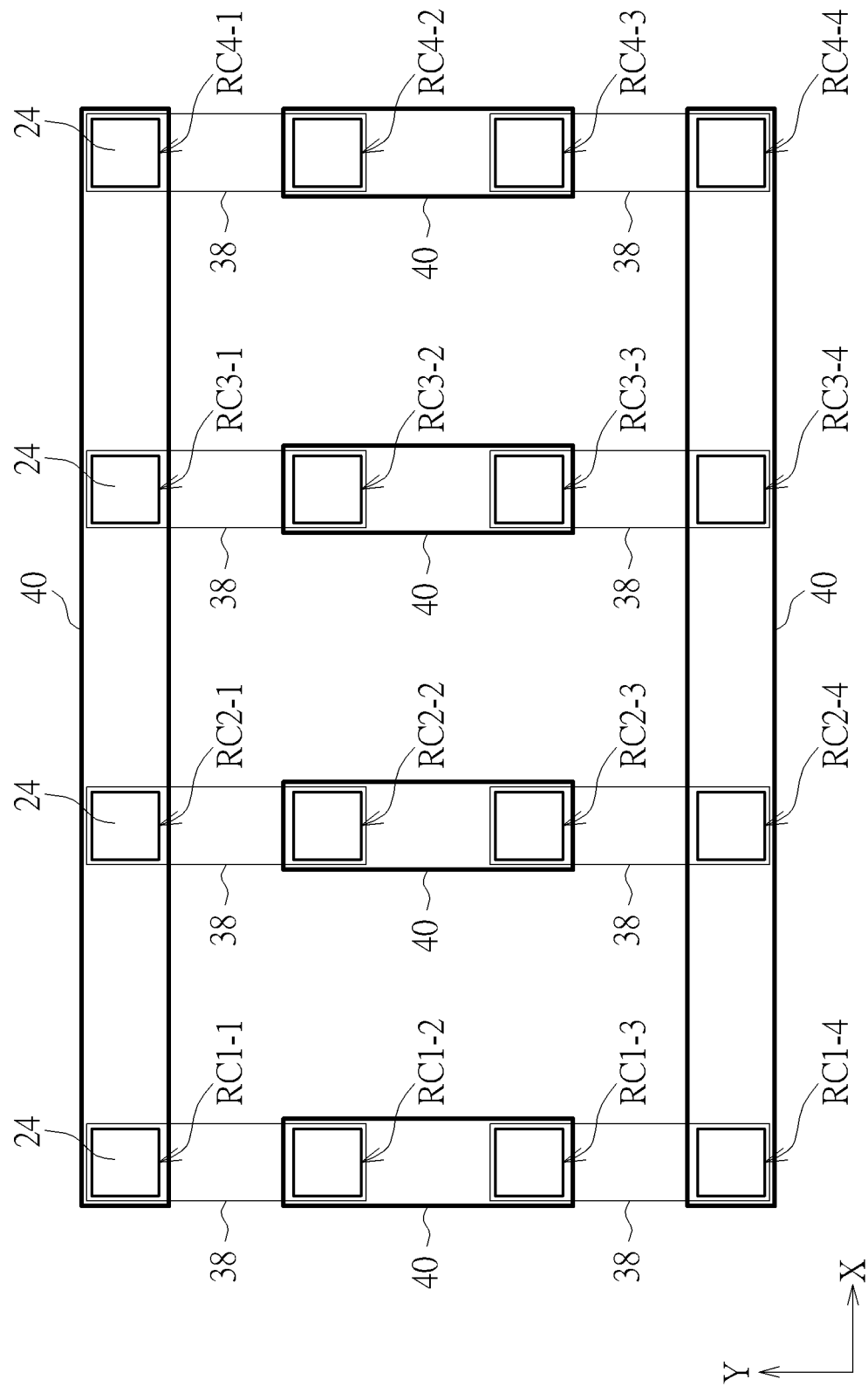
FIG. 6 illustrates a top view of connecting metal interconnections in the reference array as shown in FIG. 5.

Referring to FIGS. 5-6, FIG. 5 illustrates a perspective diagram of a reference array according to an embodiment of the present invention and FIG. 6 illustrates a top view of connecting metal interconnections in the reference array as shown in FIG. 5. As shown in FIG. 5, the reference array 16 preferably includes a plurality of device strings connected or coupled in parallel, each of the device strings includes a plurality of MTJs coupled in serial, and the quantity of MTJs of each of the device strings is equal to the quantity of the device strings. In contrast to the embodiment shown in FIG. 2 includes two device strings, the present embodiment includes a first device string DS1, a second device string DS2, a third device string DS3, and a fourth device string DS4 coupled in parallel at nodes 34, 36, in which each of the first device string DS1, the second device string DS2, the third device string DS3, and the fourth device string DS4 includes four sets of reference cells. For instance the first device string DS1 includes a first reference cell RC1-1, a second reference cell RC1-2, a third reference cell RC1-3, and a fourth reference cell RC1-4 coupled in serial, the second device string DS2 includes a first reference cell RC2-1, a second reference cell RC2-2, a third reference cell RC2-3, and a fourth reference cell RC2-4 coupled in serial, the third device string DS3 includes a first reference cell RC3-1, a second reference cell RC3-2, a third reference cell RC3-3, and a fourth reference cell RC3-4 coupled in serial, and the fourth device string DS4 includes a first reference cell RC4-1, a second reference cell RC4-2, a third reference cell RC4-3, and a fourth reference cell RC4-4 coupled in serial. Preferably, each of the first reference cell, the second reference cell, the third reference cell, and the fourth reference cell includes a MTJ 24.

In this embodiment, the MTJ 24 in each of the reference cells at least includes the aforementioned pinned layer 28, barrier layer 30, and free layer 32, in which the pinned layer 28 or free layer 32 of the MTJ 24 in first reference cell of each device string is coupled to the same pinned layer 28 or free layer 32 of the MTJ 24 in the second reference cell, the pinned layer 28 or free layer 32 of the MTJ 24 in second reference cell is coupled to the same pinned layer 28 or free layer 32 of the MTJ 24 in the third reference cell, and the pinned layer 28 or free layer 32 of the MTJ 24 in third reference cell is coupled to the same pinned layer 28 or free layer 32 of the MTJ 24 in the fourth reference cell.

For instance, the pinned layer 28 of the MTJ 24 in first reference cell RC1-1 of the first device string DS1 could be coupled to the pinned layer 28 of the MTJ 24 in second reference cell RC1-2, the free layer 32 of the MTJ 24 in second reference cell RC1-2 could be coupled to the free layer 32 of the MTJ 24 in third reference cell RC1-3, and the pinned layer 28 of the MTJ 24 in third reference cell RC1-3 could be coupled to the pinned layer 28 of the MTJ 24 in fourth reference cell RC1-4. The pinned layer 28 of the MTJ 24 in first reference cell RC2-1 of the second device string DS2 could be coupled to the pinned layer 28 of the MTJ 24 in second reference cell RC2-2, the free layer 32 of the MTJ 24 in second reference cell RC2-2 could be coupled to the free layer 32 of the MTJ 24 in third reference cell RC2-3, and the pinned layer 28 of the MTJ 24 in third reference cell RC2-3 could be coupled to the pinned layer 28 of the MTJ 24 in fourth reference cell RC2-4. The pinned layer 28 of the MTJ 24 in first reference cell RC3-1 of the third device string DS3 could be coupled to the pinned layer 28 of the MTJ 24 in second reference cell RC3-2, the free layer 32 of the MTJ 24 in second reference cell RC3-2 could be coupled to the free layer 32 of the MTJ 24 in third reference cell RC3-3, and the pinned layer 28 of the MTJ 24 in third reference cell RC3-3 could be coupled to the pinned layer 28 of the MTJ 24 in fourth reference cell RC3-4. The pinned layer 28 of the MTJ 24 in first reference cell RC4-1 of the fourth device string DS4 could be coupled to the pinned layer 28 of the MTJ 24 in second reference cell RC4-2, the free layer 32 of the MTJ 24 in second reference cell RC4-2 could be coupled to the free layer 32 of the MTJ 24 in third reference cell RC4-3, and the pinned layer 28 of the MTJ 24 in third reference cell RC4-3 could be coupled to the pinned layer 28 of the MTJ 24 in fourth reference cell RC4-4.

In other words, the reference array of this embodiment includes a total of 16 MTJs 24, in which the four MTJs 24 in the first device string DS1, the four MTJs 24 in the second device string DS2, the four MTJs 24 in the third device string DS3, and the four MTJs 24 in the fourth device string DS4 preferably share same arrangement. That is if the first reference cell RC1-1 of the first device string DS1 were connected to the second reference cell RC1-2 by connecting the pinned layer 28 in the MTJ 24 of the first reference cell RC1-1 to the pinned layer 28 in the MTJ 24 of the second reference cell RC1-2, all of the first reference cells RC2-1, RC3-1, and RC4-1 in device strings DS2, DS3, DS4 would be connected to the second reference cells RC2-2, RC3-2, RC4-2 by connecting the pined layers 28 in the MTJs 24 of first reference cells RC2-1, RC3-1, and RC4-1 to the pinned layer 28 in the MTJs 24 of second reference cells RC2-2, RC3-2, and RC4-2. Nevertheless, according to an embodiment of the present invention, if the first reference cell RC1-1 of the first device string DS1 were connected to the second reference cell RC1-2 by connecting the free layer 32 in the MTJ 24 of the first reference cell RC1-1 to the free layer 32 in the MTJ 24 of the second reference cell RC1-2, then the second reference cell RC1-2 would be connected to the third reference cell RC1-3 by connecting the pinned layer 28 in the MTJ 24 of the second reference cell RC1-2 to the pinned layer 28 in the MTJ 24 of the third reference cell RC1-3, and the third reference cell RC1-3 would be connected to the fourth reference cell RC1-4 by connecting the free layer 32 in the MTJ 24 of the third reference cell RC1-3 to the free layer 32 in the MTJ 24 of the fourth reference cell RC1-4. Accordingly, the arrangements from the first reference cells to the fourth references in each of the second device string DS2, third device string DS3, and the fourth device string DS4 would be the same as the arrangement of the first device string DS1, which are all within the scope of the present invention.

Regarding the connections for the MTJs as shown in FIG. 6, the metal interconnections 38 connecting or coupling the pinned layers 28 in the first reference cells RC1-1, RC2-1, RC3-1, RC4-1 and pinned layers 28 in the second reference cells RC1-2, RC2-2, RC3-2, RC4-2 in the first device string DS1, second device string DS2, third device string DS3, and fourth device string DS4 along a first direction (such as Y-direction) are preferably lower level metal interconnections 38 and the metal connections 38 connecting the pinned layers 28 in the third reference cells RC1-3, RC2-3, RC3-3, RC4-3 and pinned layers 28 in the fourth reference cells RC1-4, RC2-4, RC3-4, RC4-4 along the Y-direction are also lower level metal interconnections 38. The metal interconnection 40 connecting the free layers 32 in the second reference cells RC1-2, RC2-2, RC3-2, RC4-2 and free layers 32 in the third reference cells RC1-3, RC2-3, RC3-3, RC4-3 along the same Y-direction, the metal interconnection 40 connecting the first reference cells RC1-1 of the first device string DS1, the first reference cell RC2-1 of the second device string DS2, the first reference cell RC3-1 of the third device string DS3, and the first reference cell RC4-1 of the fourth device string DS4 along the second direction (such as X-direction), and the metal interconnection 40 connecting the fourth reference cells RC1-4 of the first device string DS1, the fourth reference cell RC2-4 of the second device string DS2, the fourth reference cell RC3-4 of the third device string DS3, and the fourth reference cell RC4-4 of the fourth device string DS4 along the same X-direction on the other hand are preferably upper level metal interconnections.

It should be noted that even though the device strings disclosed in this embodiment and aforementioned embodiment are limited to two device strings and four device strings, according to other embodiments of the present invention, the reference array of the MRAM could also include N device strings, in which N is preferably greater than or equal to 2 while N being an even integer. In other words, in addition to the aforementioned embodiments having N=2 or N=4 device strings, it would also be desirable to apply the various arrangements of reference cells in the aforementioned embodiments to MRAM device having 4 or more reference arrays, which are all within the scope of the present invention.

Similar to the aforementioned embodiments, each of the MTJs 24 in the device strings of this embodiment could include a low resistance state (R0 or also referred to as P state) MTJ or a high resistance state (R1 or also referred to as AP state) MTJ. For instance in the device string DS1, the MTJ 24 of the first reference cell RC1-1 could be a low resistance MTJ 24, the MTJ 24 of the second reference cell RC1-2 could be a high resistance MTJ 24, the MTJ 24 of the third reference cell RC1-3 could be a low resistance MTJ 24, and the MTJ 24 of the fourth reference cell RC1-4 could be a high resistance MTJ 24, and the equivalence resistance ($R_{eq}$) of the MTJs 24 of the entire reference array 16 in this embodiment is equal to an average of the sum of a high resistance of one of the MTJs 24 and a low resistance of another MTJs 24 according to an initial condition of the MTJs. In other words, the equivalence resistance ($R_{eq}$) of the MTJs 24 in the reference array 16 is not limited to any arrangement of the MTJs 24 and the equivalence resistance ($R_{eq}$) of the MTJs 24 could be obtained by adding the resistance of a low resistance MTJ from any MTJ in the reference array with the resistance of a high resistance MTJ from another MTJ in the reference array an then divide the sum by half. By using this approach to calculate the equivalence resistance ($R_{eq}$) of the MTJs it would be desirable to reduce of influence of outliers thereby achieving a much more stable reference voltage output.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A magnetic random access memory (MRAM), comprising:
   device strings coupled in parallel, each comprising magnetic tunnel junctions (MTJs) coupled in serial, wherein a number of the MTJs of each of the device strings is equal to a number of the device strings, wherein in each one of the device strings, one of the MTJs has a pinned layer coupled to a pinned layer of a neighboring one of the MTJs by a lower level metal interconnection, and an equivalent resistance ($R_{eq}$) of the MTJs is equal to an average of the sum of a high resistance of one of the MTJs and a low resistance of another MTJ.

2. The MRAM of claim 1, wherein the device strings comprise a first device string and a second device string coupled in parallel.

3. The MRAM of claim 2, wherein the first device string comprises a first reference cell and a second reference cell.

4. The MRAM of claim 3, wherein the first reference cell and the second reference cell are coupled in serial.

5. The MRAM of claim 3, wherein the first reference cell comprises a first MTJ and the second reference cell comprises a second MTJ.

6. The MRAM of claim 5, wherein each of the first MTJ and the second MTJ comprises a free layer and a pinned layer.

7. The MRAM of claim 6, wherein the pinned layer of the first MTJ is coupled to the pinned layer of the second MTJ by the lower level metal interconnection.

8. The MRAM of claim 1, wherein each of the device strings comprises a first device string, a second device string, a third device string, and a fourth device string coupled in parallel.

9. The MRAM of claim 8, wherein the first device string comprises a first reference cell, a second reference cell, a third reference cell, and a fourth reference cell.

10. The MRAM of claim 9, wherein the first reference cell, the second reference cell, the third reference cell, and the fourth reference cell are coupled in serial.

11. The MRAM of claim 9, wherein the first reference cell comprises a first MTJ, the second reference cell comprises a second MTJ, the third reference cell comprises a third MTJ, and the fourth reference cell comprises a fourth MTJ.

12. The MRAM of claim 11, wherein each of the first MTJ, the second MTJ, the third MTJ, and the fourth MTJ comprises a free layer and a pinned layer.

13. The MRAM of claim 12, wherein the pinned layer of the first MTJ is coupled to the pinned layer of the second MTJ by the lower level metal interconnection.

14. The MRAM of claim 12, wherein the free layer of the second MTJ is coupled to the free layer of the third MTJ by an upper level metal interconnection.

15. The MRAM of claim 12, wherein the pinned layer of the third MTJ is coupled to the pinned layer of the fourth MTJ by another lower level metal interconnection.

16. The MRAM of claim 1, further comprising a sense amplifier, wherein the sense amplifier comprises:
- a first input terminal coupled to a memory cell; and
- a second input terminal coupled to a node and the node is further coupled to one of the device strings.

17. The MRAM of claim 16, wherein the memory cell comprises:
- a transistor comprising a source coupled to a MTJ, a gate coupled to a word line, and a drain coupled to a scan line and the sense amplifier; and
- a bit line coupled to the MTJ.

18. The MRAM of claim 17, further comprising a reverse read current from the bit line to the drain of the transistor.

19. A magnetic random access memory (MRAM), comprising:
- device strings coupled in parallel, each comprising magnetic tunnel junctions (MTJs) coupled in serial, wherein a number of the MTJs of each of the device strings is equal to a number of the device strings, wherein in each one of the device strings, one of the MTJs has a free layer coupled to a free layer of a neighboring one of the MTJs by an upper level metal interconnection, and an equivalent resistance ($R_{eq}$) of the MTJs is equal to an average of the sum of a high resistance of one of the MTJs and a low resistance of another MTJ.

* * * * *